United States Patent [19]

Engeler

[11] 4,374,334

[45] Feb. 15, 1983

[54] SIGNAL COMPARATOR APPARATUS

[75] Inventor: William E. Engeler, Scotia, N.Y.

[73] Assignee: General Electric Company, Schenectady, N.Y.

[21] Appl. No.: 246,541

[22] Filed: Mar. 23, 1981

[51] Int. Cl.³ .................. H03K 5/24; H01L 29/78
[52] U.S. Cl. .................................. 307/355; 357/23; 357/24
[58] Field of Search .................. 357/24, 23 C; 307/221 D, 355

[56] References Cited

U.S. PATENT DOCUMENTS

| 4,071,775 | 1/1978 | Hewes | 357/24 |
| 4,150,304 | 4/1979 | Jensen | 357/24 |
| 4,277,702 | 7/1981 | Hamilton et al. | 357/24 |
| 4,291,243 | 9/1981 | Hamilton et al. | 357/24 |

Primary Examiner—Gene M. Munson
Attorney, Agent, or Firm—Julius J. Zaskalicky; James C. Davis, Jr.; Marvin Snyder

[57] ABSTRACT

A first surface charge transistor and a second surface charge transistor are provided in a common substrate. During a first phase of a cycle of operation a first voltage signal is applied to the transfer gate of the first transistor and a second voltage signal is applied to the transfer gate of the second transistor. During a second phase of the cycle of operation, the first voltage signal is applied to the transfer gate of the second transistor and the second voltage signal is applied to the transfer gate of the first transistor. During the first phase the source region and the transfer gate region of each of the transistors are equilibrated. The receiver regions or nodes of each of the transistors are precharged and then floated or isolated. During the second phase of the cycle, the receiver nodes accumulate an amount of charge proportional to the change of voltage resulting from the switching of the signals. Charge is received, however, only if a transfer gate becomes more positive (for n-channel transistors). The receiver node associated with the more positive signal in the first phase of operation will therefore remain charged while the receiver node associated with the more negative signal will be discharged, by transfer of charge, toward ground. The extent of the potential change is proportional to the difference between the two voltage signals and the gain of the surface charge transistors.

5 Claims, 7 Drawing Figures

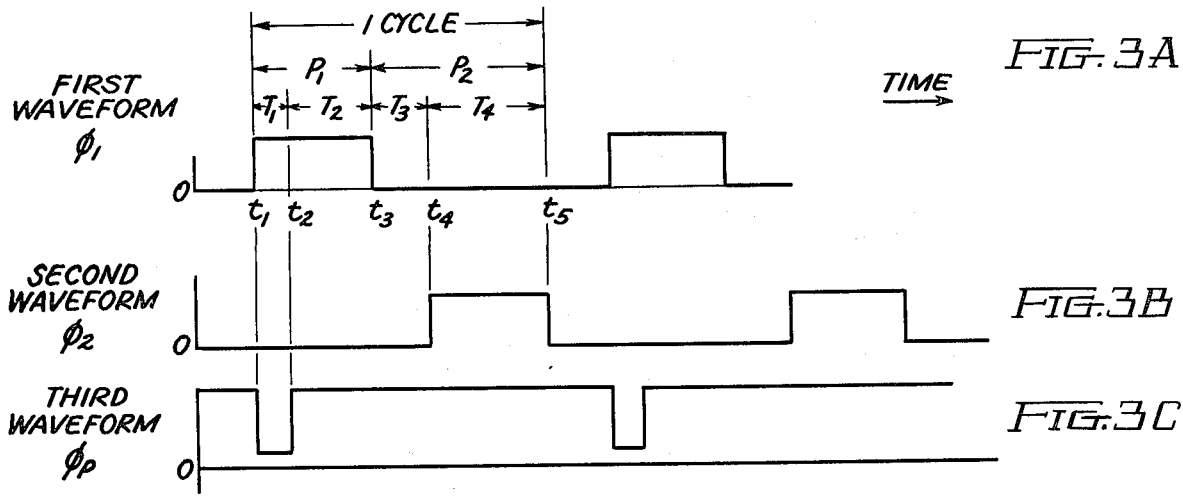
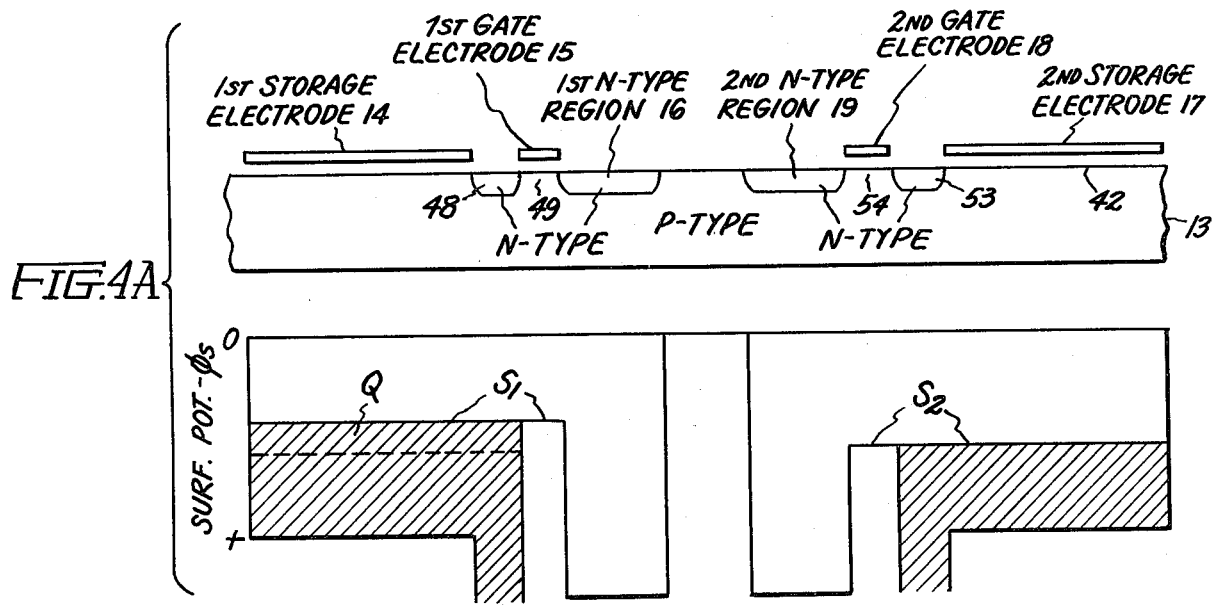
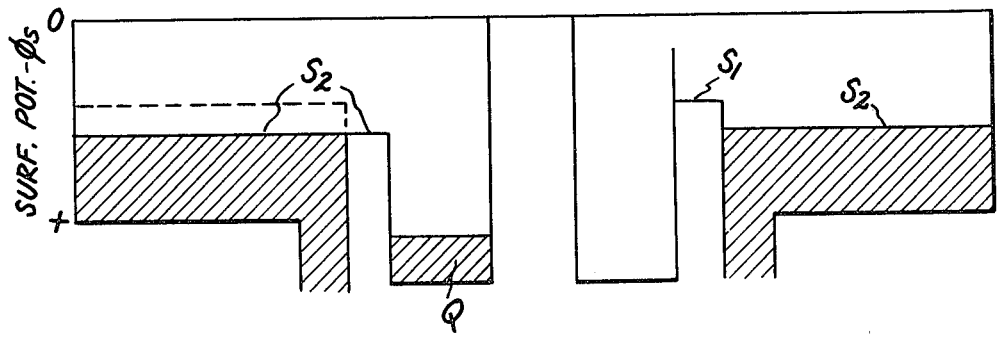

SIGNAL COMPARATOR APPARATUS

This invention relates to signal comparator apparatus for comparing or sensing the difference in levels of a pair of signals.

Comparator circuits are commonly used for comparing or sensing the difference in levels of a pair of electrical signals. Such comparator circuits commonly used comprise a pair of input channels including MOSFET transistors to which the signals to be compared are applied. Unless the threshold voltages of the transistor devices in the two channels are matched, errors, referred to as offset errors are produced in the output.

The present invention is directed to providing a differential sensing circuit free of offset errors.

An object of the present invention is to provide a circuit of obtaining the difference between two signals free of other common mode signals and offset errors.

Another object of the present invention is to provide a circuit for a comparator of high accuracy.

In carrying out the invention in an illustrative embodiment thereof there is provided a substrate of semiconductor material of one conductivity type having a major surface. A first storage electrode is provided insulatingly overlying a first storage region of the substrate adjacent the major surface thereof. A first gating electrode is provided insulatingly overlying a first barrier region of the substrate adjacent the major surface and contiguous to the first storage region. A first region of opposite conductivity type is provided in the major surface and coupled to the first barrier region. A second storage electrode is provided insulatingly overlying a second storage region of the substrate adjacent the major surface thereof. A second gating electrode is provided insulatingly overlying a second barrier region of the substrate adjacent the major surface and contiguous to the second storage region. A second region of opposite conductivity type is provided in the major surface and coupled to the second barrier region. Means are provided for applying during a first period of time a first voltage signal to the first gating electrode to establish in the first barrier region a surface potential corresponding to the level of the first voltage signal. Means are provided for applying during the first period of time a second voltage signal to the second gating electrode to establish in the second barrier region a surface potential corresponding to the level of the second voltage signal. Means are provided for applying a first storage voltage to the first storage electrode to establish surface inversion in the first storage region in the substrate at the surface potentials in the first barrier region and the second barrier region produced by the first and second voltage signals. Means are provided for charging the first storage region to establish equilibrium of potentials between the first storage region and the first barrier region. Means are provided for applying a second storage voltage to the second storage electrode to establish surface inversion in the second storage region in the substrate at the surface potentials in the first barrier region and the second barrier region produced by the first and second voltage signals. Means are provided for charging the second storage region to establish equilibrium of potentials between the second storage region and the second barrier region. Means are provided for charging the first region of opposite conductivity type and the second region of opposite conductivity type to a predetermined potential which is energetically lower for minority carriers in the substrate than the surface potentials of the first and second barrier regions during the first period of time.

Means are provided for electrically isolating the first and second regions of opposite conductivity type from the charging means during a second period of time. Means are provided for disconnecting the first voltage signal from the first gating electrode and the second voltage signal from the second gating electrode during a first subperiod of the second period. Means are provided for connecting the first voltage signal to the second gating electrode and for connecting the second voltage signal to the first gating electrode during a succeeding second subperiod of the second period, whereby charge flows into one of the regions of opposite conductivity type during the second subperiod of the second period changing the potential thereof with respect to the other of the regions of opposite conductivity type if the surface potential of the one of the first and second barrier regions adjacent thereto is energetically lowered in potential for minority carriers in the substrate.

The features which are believed to be characteristic of the present invention are set forth with particularity in the appended claims. The invention itself, both as to its organization and method of operation, together with further objects and advantages thereof may best be understood by reference to the following description taken in connection with the accompanying drawings in which:

FIGS. 3A–3C show diagrams of voltage waveforms utilized in the operation of the apparatus of FIGS. 1 and 2.

FIG. 4A is a sectional view of the surface charge devices of the apparatus of FIGS. 1 and 2 including a diagram of semiconductor surface potential versus distance along the surface of the semiconductor substrate at one instant of time useful in explaining the operation of the comparator apparatus.

FIG. 4B is a diagram of semiconductor surface potential versus distance along the surface of the substrate at another instant of time.

Figure 1:
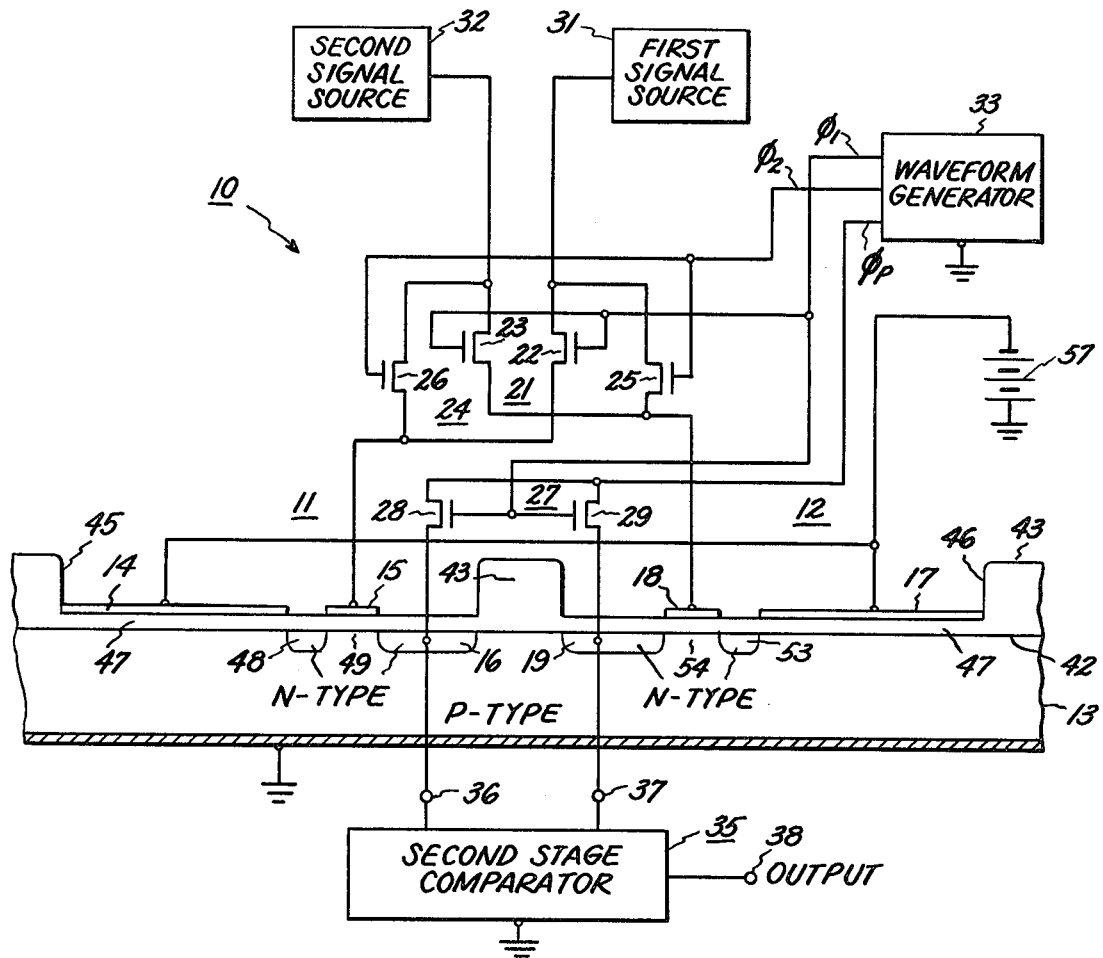
FIG. 1 is a circuit diagram of comparator apparatus including a pair of surface charge devices in accordance with an embodiment of the present invention.
Figure 2:
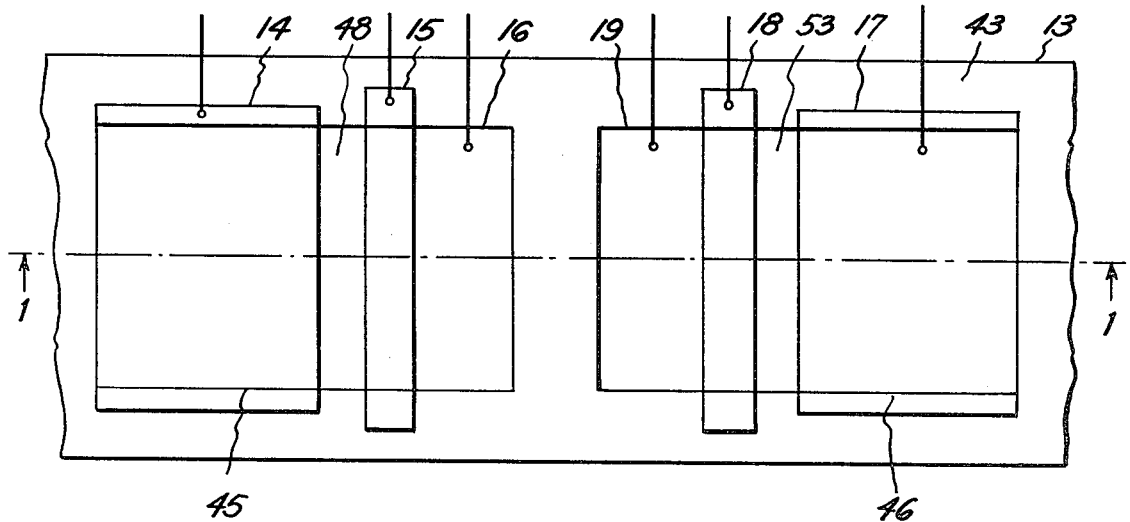
FIG. 2 is a plan view of surface charge devices of the apparatus of FIG. 1.

Reference is made to FIGS. 1 and 2 which show apparatus 10 for sampling the levels of a first electrical signal and a second electrical signal for obtaining an amplified output of the difference in levels of the samples of the two electrical signals. The apparatus 10 includes a first surface charge device 11 and a second surface charge device 12 located in a common substrate 13 of P-type conductivity. The first device 11 includes a first storage electrode 14, a first gating electrode 15, and a first region 16 of opposite or N-type conductivity type providing a source of minority carriers in the substrate. The second device 12 includes a second storage electrode 17, a second gate electrode 18, and a second region 19 of N-type conductivity type in the substrate. The apparatus also includes a first control circuit 21 having a MOSFET transistor 22 and a MOSFET transistor 23 for connecting the first signal to the first gating electrode 15 of the first surface charge device 11 and the second signal to the second gating electrode 18 of the second surface charge devices 12 during a first period of time in response to a first control waveform $\phi_1$. The apparatus also includes a second control circuit 24 having a MOSFET transistor 25 and a MOSFET transistor 26 for connecting the first signal to the second gating electrode 18 of the second surface charge device 12 and the second signal to the first gating electrode 16 of the first surface charge devices 11 during a second period of time in response to a second control waveform $\phi_2$. The apparatus also includes a third control circuit 27 having a MOSFET transistor 28 and a MOSFET transistor 29 for applying to a third control waveform $\phi_p$ the first and second regions 16 and 19 of N-type conductivity type of the surface charge devices 11 and 12. The first electrical signal is provided by signal source 31 and the second electrical signal is provided by signal source 32. The first control waveform $\phi_1$, the second control waveform $\phi_2$ and the third control waveform $\phi_p$ are obtained from the waveform generator 33. A second stage comparator 35 of conventional design having a pair of input terminals 36 and 37 and an output terminal 38 is provided for obtaining further amplification of the difference in potential between the first region 16 of N-type conductivity type and the second region 19 of N-type conductivity type.

The surface charge devices 11 and 12 are formed on a substrate 13 of monocrystalline silicon semiconductor material of P-type conductivity and relatively high resistivity, for example 10 ohm cm. A thick layer 43 of insulation, such as silicon dioxide, is formed on a major surface 42 of the substrate. The substrate may conveniently be 10 mils thick and the layer of thick insulation may be 1 micron thick. A pair of rectangular recesses 45 and 46 are formed in the thick insulating layer extending to within a short distance of the major surface 42 of the semiconductor substrate to provide a thin layer 47 of insulation, for example 0.1 micron thick. Overlying a major portion of the recess 45 and also extending over adjacent portions of the thick insulating layer is a conductive member 14 constituting the first storage electrode. A region 48 of N-type conductivity is provided in the substrate contiguous to the region of the substrate underlying electrode 14. The N-type region 48 conductively couples the first storage region underlying first storage electrode 14 to the first barrier region. Alternatively the N-type region 48 may be eliminated and the first barrier region located contiguous to the first storage region to provide coupling as is commonly employed in other charge coupled structures. Another region 16 of N-type conductivity is provided in the substrate spaced from the N-type region 48 by a barrier region 49. Conveniently the region 16 is designated as the first region of N-type conductivity. A first gate electrode 15 is provided on the thin layer 47 of insulation overlying the barrier region 49. Overlying a major portion of the recess 46 and also extending over adjacent portions of the thick insulating layer 43 is a conductive member 17 constituting the second storage electrode. A region 53 of N-type conductivity is provided in the substrate contiguous to the region of the substrate underlying electrode 17. The N-type region 53 conductively couples the second storage region underlying second storage electrode 17 to the second barrier region. Alternatively the N-type region 53 may be eliminated and the second barrier region located contiguous to the second storage region to provide coupling as is commonly employed in other charge coupled structures. Another region 19 of N-type conductivity is provided in the substrate spaced from the N-type region by a barrier region 54. Conveniently the region 19 is designated as the second region of N-type conductivity. A second gate electrode 18 is provided on the thin layer 47 of insulation overlying the barrier region 54. The conductive members 14, 15, 17 and 18 may be constituted of, for example, doped polycrystalline silicon or metals, such as aluminum and molybdenum. The substrate 13 is connected to ground. The first storage electrode 14 and the second storage electrode 17 are connected to the negative terminal of a source 57 of potential, the positive terminal of which is connected to ground. The potential of the source 57 is set to establish in the regions of the substrate underlying the first storage electrode 14 and the second storage electrode 17 in the absence of accumulated minority carriers thereat a depletion surface potential greater in absolute value than the absolute value of the surface potential in the barrier regions underlying the first and second gate electrodes 15 and 18 in response to the application of voltage signals to these gate electrodes, as will be explained below. Expressed in other words, the potential of the source 57 is set to establish in these regions surface inversion at the surface potentials of the first barrier region 49 and the second barrier region 54 produced by the first and second voltage signals.

The first signal source 31 is connected through the source-to-drain conduction path of the transistor 22 to the first gate electrode 15 of the first surface charge device 11 and is also connected through the source-to-drain conduction path of transistor 25 to the second gate electrode 18 of the second surface charge device 12. The second voltage signal source 32 is connected through the source-to-drain conduction path of transistor 26 to the first gate electrode 15 of the first surface charge device 11 and is also connected through the source-to-drain conduction path of transistor 23 to the second gate electrode 18 of the second surface charge device 12. The gates of transistors 22 and 23 are connected to the first terminal of the waveform generator 33 supplying the first waveform $\phi_1$. The gates of transistors 25 and 26 are connected to the second terminal of the waveform generator 33 supplying the second waveform $\phi_2$. The first region 16 of N-type conductivity is connected through the source-to-drain conduction path of transistor 28 to the third terminal of the waveform generator 33 supplying the third waveform $\phi_p$. The second region 19 of N-type conductivity is also connected through the source-to-drain conduction path of transistor 29 to the terminal of the waveform generator supplying the third waveform $\phi_p$. The gates of the transistors 28 and 29 are connected to the first terminal of the waveform generator providing the first waveform $\phi_1$. Input terminal 36 of comparator 35 is connected to the first region 16 of N-type conductivity and the input terminal 37 of the comparator is connected to the second region 19 of N-type conductivity.

The operation of the apparatus of FIGS. 1 and 2 will now be described in connection with the waveform diagrams of FIGS. 3A-3C and also in connection with the surface potential diagrams of FIGS. 4A and 4B. FIGS. 3A-3C show waveforms $\phi_1$, $\phi_2$ and $\phi_p$ obtained from waveform generator 33 for functioning the apparatus 10. All of the waveforms are drawn to a common time scale. A cycle of operation of the apparatus is constituted of two periods $P_1$ and $P_2$. The first period $P_1$ has a first sub-period $T_1$ and a succeeding sub-period $T_2$. The second sub-period has a first sub-period $T_3$ and a succeeding second sub-period $T_4$. The operation of the apparatus will be explained in terms of the actions occurring during intervals of time $T_1$-$T_4$ in response to changes in potential supplied by waveforms $\phi_1$, $\phi_2$, and $\phi_p$ to the various elements of the apparatus. FIGS. 4A and 4B show the potential at the major surface 42 of the substrate 13 for the surface charge devices 11 and 12 as a function of distance along the surface of the substrate. The waveform $\phi_1$ of FIG. 3A is applied to the gates of transistors 22 and 23. The waveform voltage $\phi_2$ of FIG. 3B is applied to the gates of transistors 25 and 26. The voltage waveform $\phi_p$ of FIG. 3C is applied to the gates of transistors 28 and 29. The first and second storage electrodes 14 and 17 are biased by source 57 to a value sufficiently positive with respect to the substrate to provide surface potentials in the substrate underlying these electrodes which are substantially more positive that the surface potential produced in the substrate underlying the first gate electrode 15 and second gate electrode 18 in response to the electrical signals applied to these gate electrodes. At time $t_1$ at the beginning of the first period $P_1$ of a cycle of operation, the waveform $\phi_1$ goes positive turning the transistors 22 and 23 ON thereby applying the first signal from the first signal source 31 to the first gate electrode 15 and applying the second signal from the second signal source 32 to the second gate electrode 18. These signals establish surface potentials in the substrate underlying these electrodes which is determined by the level of these signals. Also at time $t_1$, the transistors 28 and 29 are turned ON thereby applying voltage waveform $\phi_p$ to the first region 16 of N-type conductivity and to the second region 19 of N-type conductivity. At time $t_1$, the waveform $\phi_p$ drops to a value and stays at this value until time $t_2$. The value of potential is selected to produce a surface potential in the substrate more negative than the surface potential existing under either of the first and second gate electrodes 15 and 18. Thus, during this interval of time $T_1$, referred to as the first sub-period of the period $P_1$, charge in the form of electrons flows from the first region 16 of N-type conductivity over the surface potential barrier underlying the first gate electrode 15 into the storage region underlying the first storage electrode 14, and also charge in the form of electrons also flows over the potential barrier underlying the second gate electrode 18 into the storage region underlying the second storage electrode 17. At time $t_2$, the potential of the first N-type region 16 and the second N-type region 19 rises above the surface potentials existing in the barrier regions 49 and 54 underlying the first and second gate electrodes. During the interval $t_2$ to $t_3$, referred to as the second sub-period $T_2$ of the first period, excess charge in the first storage region spills over the potential barrier in the first barrier region 49 into the first N-type region 16 until the surface potential in first storage region equilibrates with the surface potential in the first barrier region. Also, during the interval $t_2$-$t_3$ excess charge in the second storage region spills over the potential barrier in the second barrier region 54 into the N-type region 19 until the surface potential in the second storge region equibrates with the surface potential in the second barrier region. These conditions are shown in the surface potential diagrams of FIG. 4A. At time $t_3$, the potential of the first waveform $\phi_1$ drops to a value turning OFF transistors 22 and 23 thereby disconnecting the first gate electrode 15 and the second gate electrode 18, respectively, from the first signal source 31 and the second signal source 32. Also, at time $t_3$, the transistors 28 and 29 are turned OFF thereby isolating first region 16 of opposite conductivity type and second region 19 of opposite conductivity type from the charging source 33 at the potential existing at time $t_3$. During time $t_3$-$t_4$, referred to as the first sub-period $T_3$ of the second period $P_2$, no change occurs in the voltage level of any of the waveforms $\phi_1$, $\phi_2$ and $\phi_p$. The sub-period $T_3$ enables switching of the first and second signal sources and floating or isolating of regions 16 and 19 without temporal overlap. At time $t_4$ at the beginning of the second sub-period $T_4$ of the second period $P_2$, the waveform $\phi_2$ goes positive turning transistors 25 and 26 ON thereby applying the first signal from first signal source 31 to the second gate electrode 18 and applying the second signal from second signal source 32 to the first gate electrode 15. Assume that the signal from the first source 31 is less positive than the signal from second source 32. Accordingly, during the period of time $t_1$ to $t_3$, when the first signal is applied to first gate electrode 15, the surface potential $S_1$ in the first barrier region 49 underlying the first gate electrode 15 is smaller than the surface potential $S_2$ in the second barrier region underlying the second gate 18 electrode to which the second signal is applied. This condition is shown in FIG. 4A. During the period of time $t_4$-$t_5$, when the first signal is applied to the second gate electrode 18 the surface potential in the second barrier region underlying the second gate electrode 18 becomes smaller than the surface potential in the first barrier region underlying the first gate electrode 15 to which the second signal is now applied. This condition is shown in FIG. 4B. The surface potential of second barrier region 54 underlying the second gate electrode 18 is lowered (made less positive) in relation to the surface potential of the second storage region resulting in containment of the charge in the second storage region. The potential of the second region 19 of N-type conductivity remains at its floated value. The surface potential of the first barrier region 49 underlying the first gate electrode 15 is raised (made more positive) in relation to the surface potential of the first storage region 16. Thus, a quantity Q of charge spills over the potential barrier of the first barrier region into the N-region 16 until the surface potential of the first storage region equilibrates with surface potential of the first barrier region. The charge Q is proportional to the difference in surface potentials in the first barrier region produced by the first and second signals. The charge Q collected in the N-type region 16 causes a change in potential on the N-type region 16 proportional thereto. Thus, a change in potential is produced on the region 16 of opposite conductivity type which is dependent on the difference in surface potentials produced in a barrier region underlying a gate electrode to which the two voltage signals are applied in sequence. This change in potential on N-region 16 is independent of threshold voltages of the gating electrodes. The change in potential can be made relatively large in relation to the difference in level of the signals by using N-type regions of small capacitance and storage electrodes of relatively large capacitance.

The difference in voltage level on the regions of N-type conductivity or nodes 16 and 19 are relatively large in relation to the levels of the applied signals and also are free of offset errors. This difference in voltage level may be utilized directly, for example, the circuit could be used with any of a variety of self-latching circuits well known in the art the final latching position or state of which is determined by the potential difference of the two nodes 16 and 19 on which charge is received. This difference in voltage level may be provided with additional amplification and limiting, for example, by a second stage comparator 35, as shown in FIG. 1. The amplification provided by the first and second surface charge devices 11 and 12 in effect reduces the offset error of the second stage comparator of conventional design.

While the invention has been described in connection with charge transfer devices constituted of P-type conductivity substrates, N-type conductivity substrates could as well be used. Of course, in such as case the applied potentials, regions of opposite conductivity type in the substrate and carrier types would be reversed in polarity.

While the invention has been described in a specific embodiment, it will be appreciated that modifications may be made by those skilled in the art, and it is intended by the appended claims to cover all such modifications and changes as fall within the true spirit and scope of the invention.

What is claimed is:

1. In combination,
a semiconductor substrate of one conductivity type having a major surface,
a first storage electrode insulatingly overlying a first storage region of said substrate adjacent said major surface,
a first gating electrode insulatingly overlying a first barrier region of said substrate adjacent said major surface and coupled to said first storage region,
a first region of opposite conductivity type in said major surface and coupled to said first barrier region,
a second storage electrode insulatingly overlying a second storage region of said substrate adjacent said major surface,
a second gating electrode insulatingly overlying a second barrier region of said substrate adjacent said major surface and coupled to said second storage region,
a second region of opposite conductivity type in said major surface and coupled to said second barrier region,
means for applying during a first period of time a first voltage signal to said first gating electrode to establish in said first barrier region a surface potential corresponding to the level of said first voltage signal,
means for applying during said first period of time a second voltage signal to said second gating electrode to establish in said second barrier region a surface potential corresponding to the level of said second voltage signal,
means for applying a first storage voltage to said first and said second storage electrodes sufficient to establish surface inversion in said first and said second storage regions at the surface potentials of said first and said second barrier regions produced by said first and second voltage signals,
means for providing charge to said first storage region sufficient to establish equilibrium of potentials between said first storage region and said first barrier regions,
means for providing charge to said second storage region sufficient to establish equilibrium of potentials between said second storage region and said second barrier region,
means for charging said first region of opposite conductivity type and said second region of opposite conductivity type to a predetermined potential which is energetically lower for minority carriers in said substrate than the surface potentials of said first and second barrier regions during said first period,
means for electrically isolating said first and second regions of opposite conductivity type from said charging means during a second period of time,
means for disconnecting said first voltage signal from said first gating electrode and said second voltage signal from said second gating electrode during a first subperiod of said second period,
means for connecting said first voltage signal to said second gating electrode and for connecting said second voltage signal to said first gating electrode during a succeeding second subperiod of said second period, whereby charge flows into one of the regions of opposite conductivity type during the second subperiod of said second period changing the potential thereof with respect to the other of said regions of opposite conductivity type if the surface potential of the one of said first and second barrier regions adjacent thereto is energetically lowered in potential for minority carriers in said substrate.

2. The combination of claim 1 including
means for sensing the change in potential of said one region of opposite conductivity type during the second subperiod of said second period.

3. The combination of claim 1 in which the capacitance of said first storage electrode with respect to said substrate is relatively large in relation to the capacitance of said first region of opposite conductivity with respect to said substrate, and in which the capacitance of said second storage electrode with respect to said substrate is relatively large in relation to the capacitance of said second region of opposite conductivity type with respect to said substrate.

4. The combination of claim 1 in which the capacitance of said first storage electrode with respect to said substrate is substantially the same as the capacitance of said second storage electrode with respect to said substrate, and in which the capacitance of said first region of opposite conductivity type with respect to the substrate is substantially the same as the capacitance of said second region of opposite conductivity type with respect to said substrate.

5. The combination of claim 1 in which said means for providing charge to said first storage region and said second storage region and said means for charging said first region of opposite conductivity type and said second region of opposite conductivity type to said predetermined potential comprises:
means for raising during a first subperiod of said first period the potential of each of said first and second regions of opposite conductivity type for minority carriers in said substrate to a value above the surface potential of said first barrier region and second barrier region whereby charge flows from each of said first and second regions of opposite conductivity type into a respective one of said first storage region and said second storage region, and
means for lowering during a succeeding second subperiod of said first period the potential of each of said first and second regions of opposite conductivity type for minority carriers in said substrate to a value which is lower than the surface potential of said first and second barrier regions whereby charge flows from said first storage region to said first region of opposite conductivity until the potential of said first storage region equilibrates with the potential of said first barrier region and charge flows from said second storage region to said second region of opposite conductivity type until the potential of said second storage region equilibrates with the potential of said second barrier region.

* * * * *